United States Patent
Miyanaga et al.

(10) Patent No.: US 9,595,925 B2
(45) Date of Patent: Mar. 14, 2017

(54) DISTORTION-COMPENSATING POWER AMPLIFIER AND METHOD FOR COMPENSATING FOR DISTORTION TO AMPLIFY POWER

(71) Applicant: Panasonic Corporation, Osaka (JP)

(72) Inventors: Kenji Miyanaga, Kanagawa (JP); Koji Takinami, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/883,069

(22) Filed: Oct. 14, 2015

(65) Prior Publication Data

US 2016/0118946 A1 Apr. 28, 2016

(30) Foreign Application Priority Data

Oct. 28, 2014 (JP) .................... 2014-219333

(51) Int. Cl.
*H03F 1/26* (2006.01)
*H03F 1/32* (2006.01)
*H03F 1/02* (2006.01)
*H03F 3/24* (2006.01)

(52) U.S. Cl.
CPC ......... *H03F 1/3247* (2013.01); *H03F 1/0205* (2013.01); *H03F 3/245* (2013.01); *H03F 2201/3203* (2013.01); *H03F 2201/3227* (2013.01)

(58) Field of Classification Search
CPC ....................................... H03F 1/26

USPC .......................... 330/149, 302, 306
See application file for complete search history.

(56) References Cited

U.S. PATENT DOCUMENTS

2002/0085647 A1 7/2002 Oishi et al.
2010/0295612 A1 11/2010 Ohkawara et al.

FOREIGN PATENT DOCUMENTS

| JP | 6-332456 | 12/1994 |
|---|---|---|
| JP | 8-079011 | 3/1996 |
| JP | 2000-099022 | 4/2000 |
| JP | 2005-079935 | 3/2005 |
| JP | 2010-154459 | 7/2010 |
| JP | 2011-004387 | 1/2011 |
| JP | 2012-114688 | 6/2012 |
| WO | 01/08319 | 2/2001 |

*Primary Examiner* — Patricia T Nguyen
(74) *Attorney, Agent, or Firm* — Greenblum & Bernstein, P.L.C.

(57) ABSTRACT

A distortion-compensating power amplifier compensates for nonlinear distortion in a power amplifier. The distortion-compensating power amplifier includes: a predistorter that performs pre-distortion processing, the pre-distortion processing applying an inverse characteristic of a distortion characteristic that is generated in the power amplifier to an input signal; a filter that performs band limitation on the pre-distorted input signal by using a frequency characteristic that is asymmetric with respect to a center frequency of the input signal, the filter having a filter coefficient that is a complex number; a down-sampler that down-samples the band-limited input signal; and a digital-to-analog converter that converts the down-sampled input signal from a digital signal to an analog signal.

14 Claims, 15 Drawing Sheets

FIG. 12A

| TERMINAL ID | CHANNEL |
|---|---|
| $ID_A$ | CH1 |
| $ID_B$ | CH1 |
| $ID_C$ | CH1 |
| $ID_D$ | CH2 |
| $ID_E$ | CH2 |
| $ID_F$ | CH3 |
| ... | ... |

FIG. 12B

| CHANNEL | TERMINAL ID |
|---|---|
| CH1 | $ID_A$, $ID_B$, $ID_C$ |
| CH2 | $ID_D$, $ID_E$ |
| CH3 | $ID_F$ |
| ... | ... | ced
DISTORTION-COMPENSATING POWER AMPLIFIER AND METHOD FOR COMPENSATING FOR DISTORTION TO AMPLIFY POWER

BACKGROUND

1. Technical Field

The present disclosure relates to a distortion-compensating power amplifier and a method for compensating for signal nonlinear distortion resulting from power amplification, by performing pre-distortion.

2. Description of the Related Art

In recent years, mobile equipment including, for example mobile phones and notebook computers equipped with wireless communication functions, is becoming increasingly widely used. In wireless communication devices provided in mobile equipment, adjacent-channel leakage power increases owing to nonlinear input/output characteristics of power amplifiers. The power amplifiers require high linearity for the input/output characteristics.

For example, in order for mobile equipment using a millimeter wave band to receive large amounts of data of moving images or to deliver different large amounts of data to respective users in parallel, adjacent channels are assigned to the users. When the adjacent-channel leakage power increases, interference with the adjacent channels increases.

It is, however, difficult to achieve a high power output and a high efficiency while maintaining high linearity, and it is desired to apply a nonlinear distortion compensation technique. As a system for compensating for nonlinear distortion in power amplifiers, a pre-distortion system has attracted attention in recent years. The pre-distortion system is a method in which an inverse characteristic of a distortion characteristic that is generated in a power amplifier is given to an input signal in advance and the resulting signal is then input to the power amplifier (see, for example, Japanese Unexamined Patent Application Publication No. 2005-79935 (hereinafter referred to as "Patent Document 1") and Summary in Japanese Unexamined Patent Application Publication No. 2000-99022 (hereinafter referred to as "Patent Document 2")).

SUMMARY

However, the power amplifiers disclosed in Patent Documents 1 and 2 noted above have a problem as described below.

When the sampling rate of a digital-to-analog converter (DAC) is not sufficiently high, it is difficult to suppress adjacent-channel leakage power, causing a problem in that communication in adjacent channels is interfered with.

One non-limiting and exemplary embodiment provides a distortion-compensating power amplifier that reduces interference with communication in adjacent channels even when the sampling rate of a DAC is not sufficiently high.

In one general aspect, the techniques disclosed here feature a distortion-compensating power amplifier for compensating for nonlinear distortion in a power amplifier to amplify power. The distortion-compensating power amplifier includes: a power amplifier, a predistorter that performs pre-distortion processing, the pre-distortion processing applying an inverse characteristic of a distortion characteristic that is generated in the power amplifier to an input signal; a filter that performs band limitation on the pre-distorted input signal by using a frequency characteristic that is asymmetric with respect to a center frequency of the input signal, the filter having a filter coefficient that is a complex number; a down-sampler that down-samples the band-limited input signal; and a digital-to-analog converter that converts the down-sampled input signal from a digital signal to an analog signal.

According to the present disclosure, even when the sampling rate of a DAC is not sufficiently high, it is possible to reduce interference with communication in adjacent channels.

It should be noted that general or specific embodiments may be implemented as a device, a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 12A is a table illustrating relationships between the terminals and channels used by the terminals;

FIG. 12B is a table illustrating relationships between the channels and the terminals that use the channels;

DETAILED DESCRIPTION (Background from which Details of Each Embodiment of Distortion-Compensating Power Amplifier According to Present Disclosure were Derived)

Before each embodiment of a distortion-compensating power amplifier according to the present disclosure is described, the background from which details of each embodiment of a distortion-compensating power amplifier according to the present disclosure were derived will be described first.

Figure 1:
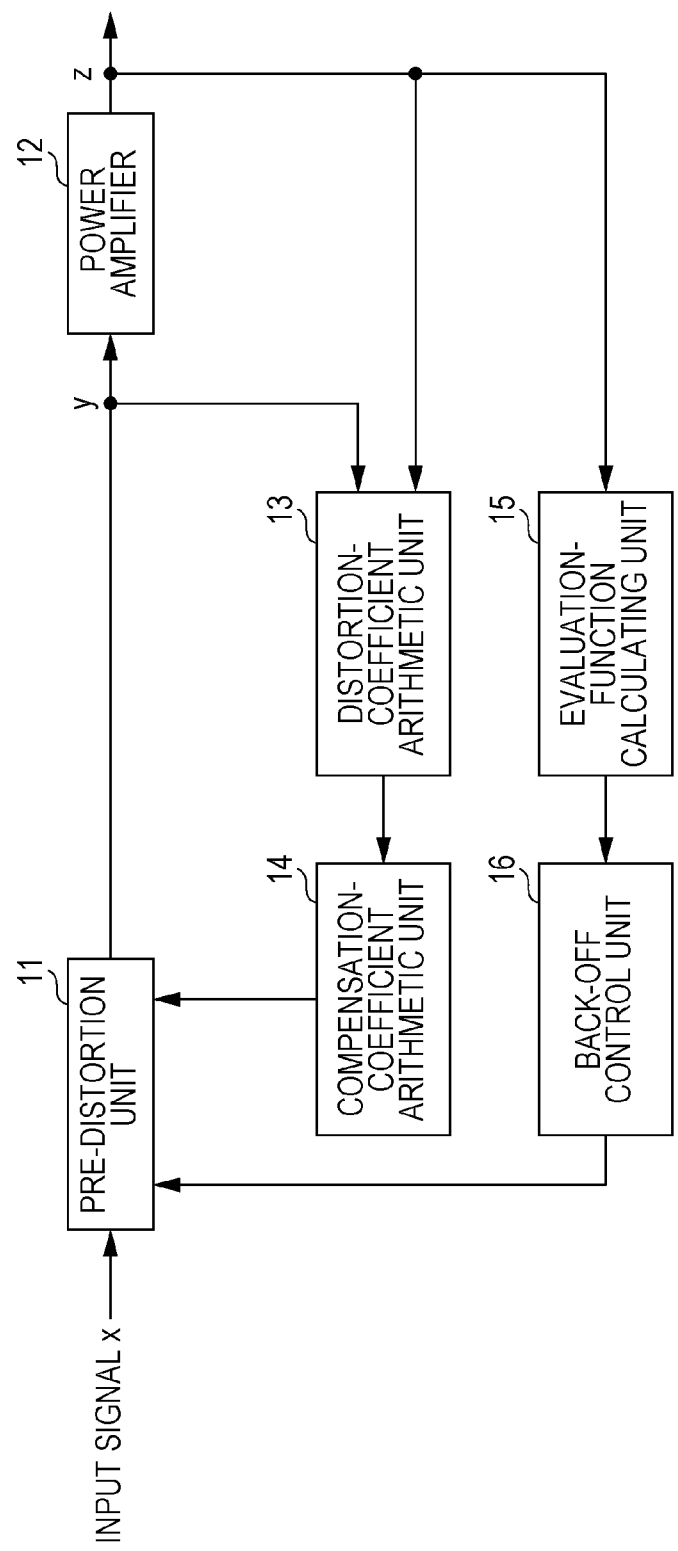
FIG. 1 illustrates the configuration of a distortion-compensating power amplifier disclosed in Patent Document 1.

Now, a description will be given of a distortion-compensating power amplifier disclosed in Patent Document 1. FIG. 1 is a block diagram illustrating the configuration of the distortion-compensating power amplifier disclosed in Patent Document 1. The distortion-compensating power amplifier in FIG. 1 includes a pre-distortion unit 11, a power amplifier 12, a distortion-coefficient arithmetic unit 13, a compensation-coefficient arithmetic unit 14, an evaluation-function calculating unit 15, and a back-off control unit 16.

In FIG. 1, the pre-distortion unit 11 gives, to an input signal x, distortion having an inverse characteristic of a nonlinear distortion characteristic of the power amplifier 12 and then outputs a signal y. The processing of the pre-distortion unit 11 is nonlinear processing.

In the power amplifier 12, the characteristic of the signal y and the nonlinear distortion characteristic of the power amplifier 12 cancel each other out, so that the signal y is distortion-compensated and is output as an output z.

The distortion-coefficient arithmetic unit 13 uses the signal y and the output z to determine a predetermined distortion coefficient Ak and outputs the distortion coefficient Ak to the compensation-coefficient arithmetic unit 14. The compensation-coefficient arithmetic unit 14 determines a compensation coefficient, based on the distortion coefficient Ak and a back-off B1, and outputs the compensation coefficient to the pre-distortion unit 11.

On the other hand, the evaluation-function calculating unit 15 calculates an adjacent-channel leakage power ratio, based on the output z, calculates an evaluation function, based on the adjacent-channel leakage power ratio and a legal value, and outputs the evaluation function to the back-off control unit 16. The back-off control unit 16 sequentially determines the back-off B1 in order to bring the evaluation function close to 0 and outputs the back-off B1 to the pre-distortion unit 11.

In order realize digital-signal processing in the pre-distortion unit 11, a digital signal output from the pre-distortion unit 11 needs to be converted into an analog signal through use of a digital-to-analog converter (DAC). Since the signal y output from the pre-distortion unit 11 has a wider signal bandwidth than that of the original signal x, it is necessary to ensure a sufficiently high sampling rate for the DAC.

However, since an increase in the sampling rate of the DAC directly leads to increases in the circuit scale and the power consumption, the sampling rate of the DAC needs to be reduced when the signal x is a wideband signal. When the sampling rate of the DAC is not sufficiently high for the bandwidth of the signal x, aliasing due to high-frequency components of the signal y occurs. Thus, there is a problem in that nonlinear distortion caused by the power amplifier 12 cannot be canceled sufficiently.

Figure 2:
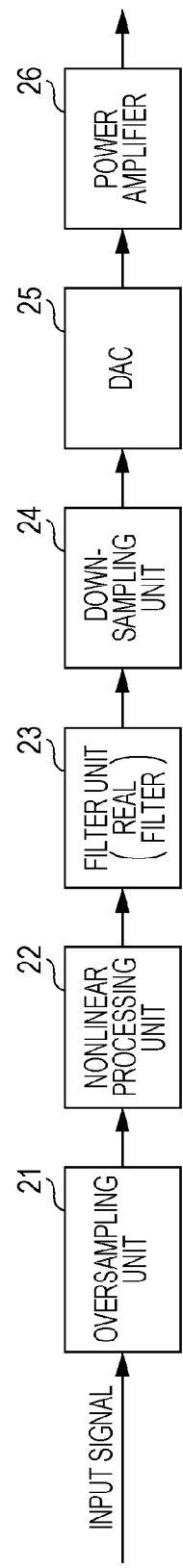
FIG. 2 illustrates the configuration of a signal processing device disclosed in Patent Document 2.
Figure 3:
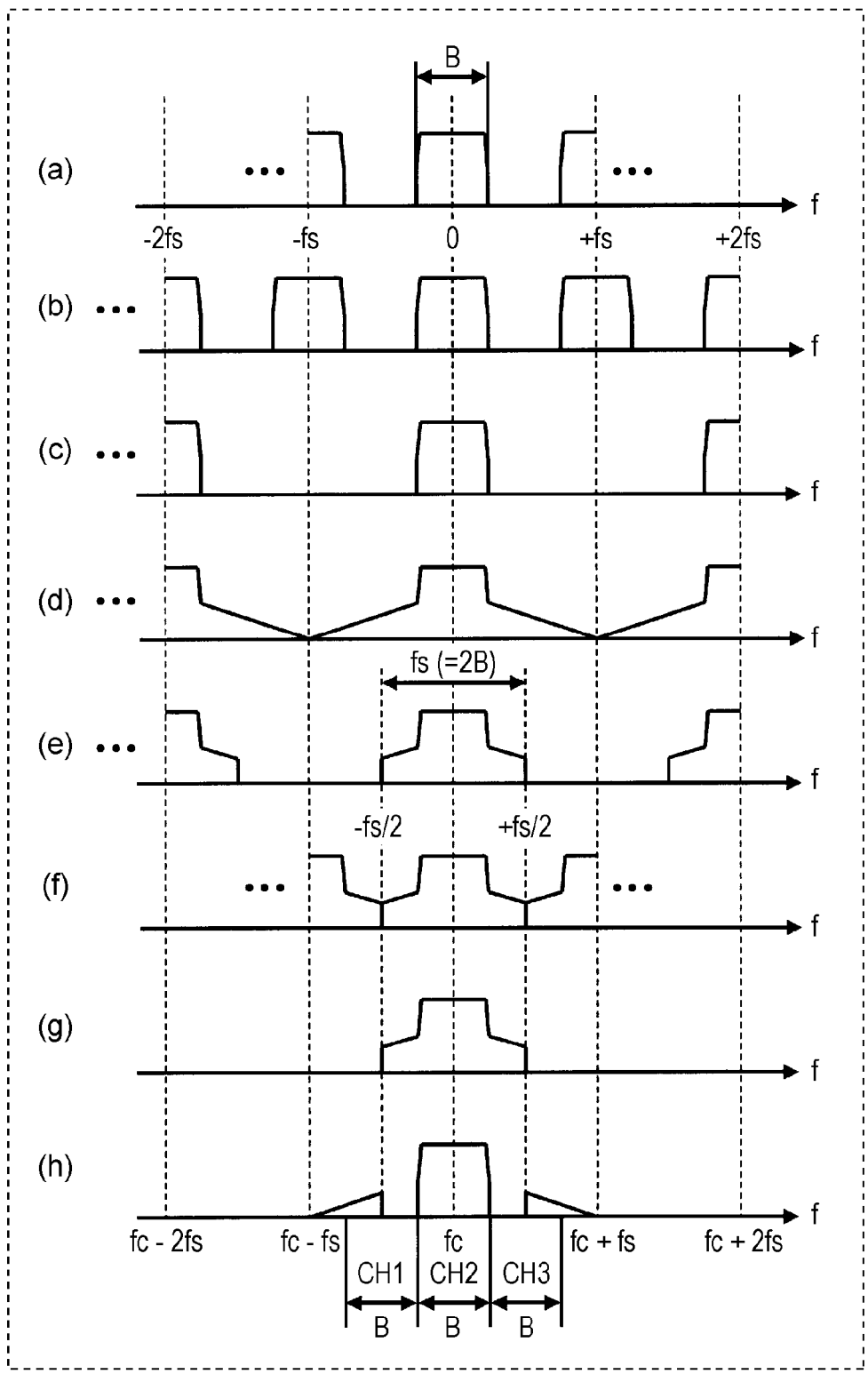
FIG. 3 illustrates signal waveforms in individual blocks in the signal processing device illustrated in FIG. 2.

As means for addressing the problem, for example, there is a signal processing device disclosed in Patent Document 2. The signal processing device disclosed in Patent Document 2 will be described below with reference to FIGS. 2 and 3. FIG. 2 is a block diagram illustrating the configuration of the signal processing device disclosed in Patent Document 2. FIG. 3 is a diagram illustrating signal waveforms in individual blocks in the signal processing device illustrated in FIG. 2. In FIG. 3, the horizontal axis f indicates a frequency, and "0" indicates the center frequency of each signal. Also, B indicates the bandwidth of an input signal, and fs indicates the sampling rate of a DAC. Also, fs=2B is given as an example in which it is difficult to ensure a sufficiently high sampling rate for the DAC. Also, fc indicates a carrier frequency. CH1 to CH3 indicate channels.

The signal processing device illustrated in FIG. 2 includes an oversampling unit 21, a nonlinear processing unit 22, a filter unit 23, a down-sampling unit 24, a DAC 25, and a power amplifier 26.

An input signal (see FIG. 3(a)) that spreads in the range of −B/2 to +B/2 with its center at the frequency 0 is input to the oversampling unit 21, and in the oversampling unit 21, the input signal is oversampled with twice the sampling rate of the input signal (see FIG. 3(b)), and the oversampled data is output to the nonlinear processing unit 22 (see FIG. 3(c)). In this example, image components that existed at portions −fs and +fs have been eliminated.

The nonlinear processing unit 22 performs, for example, nonlinear processing, which uses pre-distortion processing, on the oversampled data and outputs nonlinear oversampled data to the filter unit 23 (see FIG. 3(d)). In this case, as a result of giving an inverse characteristic of the distortion characteristic of the power amplifier 26, the bandwidth of the input signal extends from the bandwidth B (=fs/2) illustrated in FIG. 3(a) to the range between −fs and +fs.

With respect to the nonlinear oversampled data, the filter unit 23 passes frequency components of half the sampling rate of the oversampling unit 21 and outputs filtered oversampled data to the down-sampling unit 24 (see FIG. 3(e)). The filter unit 23 is a real filter having a filter coefficient that is a real number. The filtered oversampled data is band-limited in the range of −fs/2 to +fs/2.

The down-sampling unit 24 performs ½-fold down-sampling on the filtered oversampled data and outputs resulting sampled data to the DAC 25 (see FIG. 3(f)). In the frequency domain, the same spectrum of the sampled data is repeated for each sampling rate fs of the DAC 25. Although inverse distortion components also occur in a signal having its center at a frequency=−fs and a signal having its center at a frequency=+fs, the filter unit 23 preforms the band limitation to thereby avoid aliasing.

The DAC 25 performs digital-to-analog conversion on the sampled data and outputs an analog signal to the power amplifier 26 (see FIG. 3(g)). A low-pass filter (LPF, not illustrated) subsequent to the DAC 25 suppresses, of the analog signal, components outside the range of −fs/2 to +fs/2.

The power amplifier 26 amplifies the analog signal and outputs the resulting analog signal (see FIG. 3(h)). Since the power-amplified analog signal has been given the inverse characteristic by the nonlinear processing unit 22 so as not to be affected by aliasing, nonlinear distortion generated in the power amplifier 26 is canceled in the range of −fs/4 to −fs/2 and in the range of +fs/2 to +fs/4.

The signal processing device disclosed in Patent Document 2 performs processing, involving oversampling, nonlinear processing, filtering processing, and down-sampling processing, on the input signal in that order, to thereby make it possible to eliminate frequency components higher than half the sampling rate of the input signal and make it possible to reduce the occurrence of aliasing due to the nonlinear processing.

However, the signal processing device disclosed in Patent Document 2 has a problem as described below.

When the sampling rate of the DAC is not sufficiently high for the bandwidth of the input signal, a frequency range in which the effect of the pre-distortion is obtained is limited to the sampling rate of the DAC.

A case in which the sampling rate fs of the DAC is twice the bandwidth B (see FIG. 3(a)) of the input signal (that is, fs=2B) will be described by way of example. The ratio of fs to B (=fs/B) is referred to as an "oversampling ratio". In FIG. 3(h), the range in which the effect of the pre-distortion is obtained is the range of −fs/2 to +fs/2 with respect to the carrier frequency fc. When the oversampling ratio is 2, the adjacent-channel leakage power is suppressed about half of that in a case in which pre-distortion is not performed, and thus, the residual adjacent-channel leakage power interferes with the adjacent channels communication.

When the sampling rate of the DAC is not sufficiently high, it is difficult to suppress adjacent-channel leakage power, thus causing a problem in that communication in the adjacent channels is interfered with.

Accordingly, an example of a distortion-compensating power amplifier that reduces interference with communication in the adjacent channels even when the sampling rate of the DAC is not sufficiently high will be described in each embodiment described below.

Embodiments of the present disclosure will be described below in detail with reference to the accompanying drawings. In the embodiments, elements having the same or similar functions are denoted by the same reference numerals, and redundant descriptions are not given hereinafter.

First Embodiment

Figure 4:
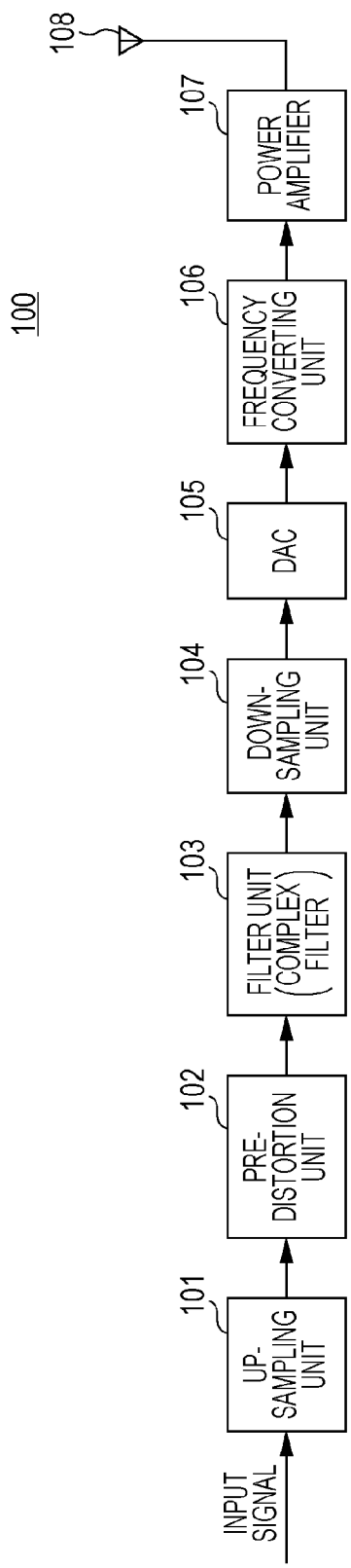
FIG. 4 illustrates the configuration of a distortion-compensating power amplifier according to a first embodiment.

FIG. 4 is a block diagram illustrating the configuration of a distortion-compensating power amplifier 100 according to a first embodiment of the present disclosure. The following description will be given of the configuration of the distortion-compensating power amplifier 100.

An up-sampling unit 101 up-samples the sampling rate of an input signal to twice the sampling rate of a DAC 105, suppresses an image signal that is generated during the up-sampling, and outputs the up-sampled signal to a pre-distortion unit 102.

In accordance with the compensation coefficient, the pre-distortion unit 102 performs pre-distortion processing, which gives distortion having an inverse characteristic of a distortion characteristic that is generated in a power amplifier 107, on the signal output from the up-sampling unit 101 and outputs the resulting signal to a filter unit 103.

The filter unit 103 is a complex filter having a filter coefficient that is a complex number. The filter unit 103 limits the band of the signal output from the pre-distortion unit 102 and outputs the resulting signal to a down-sampling unit 104. The filter unit 103 performs band limitation for reducing a band-limited bandwidth to a bandwidth smaller than or equal to the sampling rate of the DAC 105. The frequency characteristic of the filter unit 103 is asymmetric on a frequency axis with respect to the center frequency of the input signal. Details of the filter unit 103 are described later.

The down-sampling unit 104 down-samples the signal output from the filter unit 103 so that the sampling rate of the signal output from the filter unit 103 is equal to the sampling rate of the DAC 105 and outputs the resulting signal to the DAC 105.

The DAC 105 converts the signal, output from the down-sampling unit 104, from a digital signal to an analog signal and outputs the resulting analog signal to a frequency converting unit 106. The sampling rate in the DAC 105 is lower than or equal to three times the bandwidth of the signal input to the up-sampling unit 101.

The frequency converting unit 106 up-converts the signal output from the DAC 105 from a baseband to a carrier frequency and outputs the resulting signal to the power amplifier 107. For example, when the signal output from the DAC 105 is a complex I/Q signal, the frequency converting unit 106 is configured as a quadrature demodulator.

The power amplifier 107 amplifies the signal output from the frequency converting unit 106 to a predetermined power and transmits the resulting signal via an antenna 108. The inverse distortion component given by the pre-distortion unit 102 and the nonlinear distortion component that is generated in the power amplifier 107 cancel each other out, so that the power amplifier 107 can transmit a signal having a suppressed nonlinear distortion component.

Figure 5:
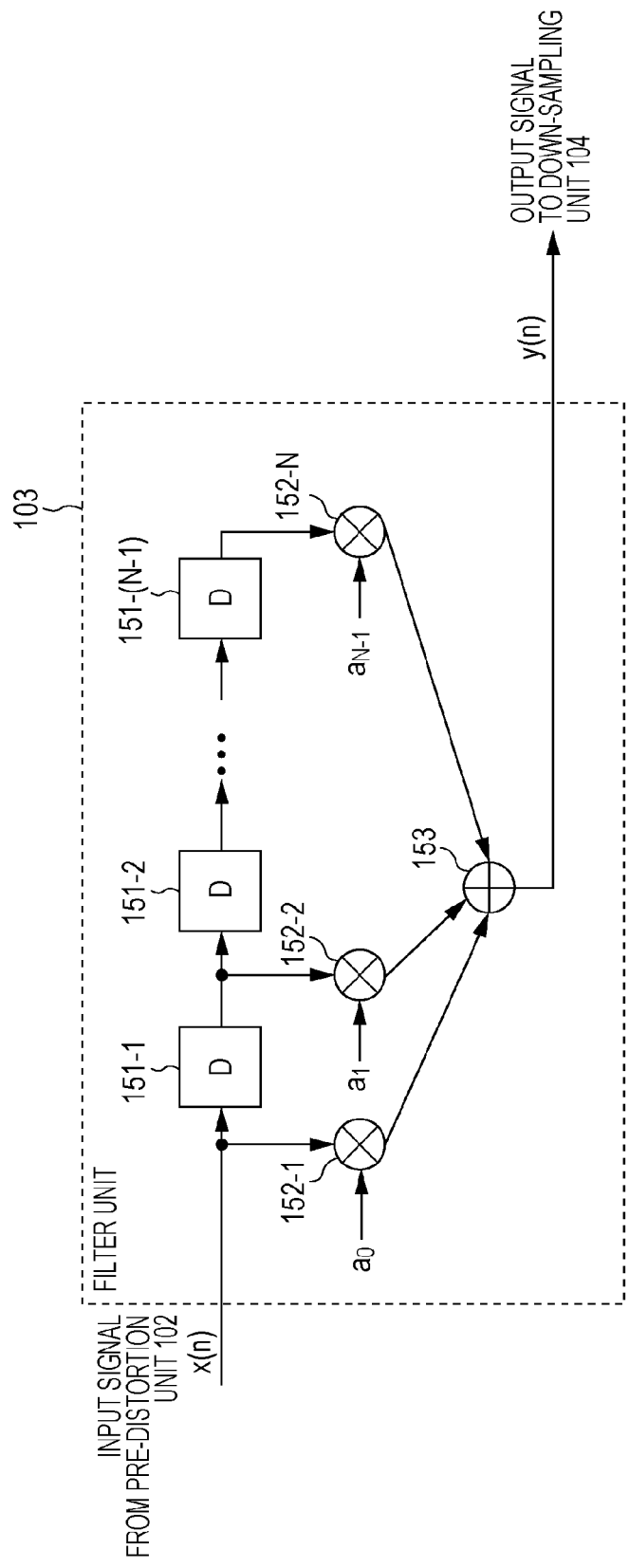
FIG. 5 illustrates the internal configuration of a filter unit illustrated in FIG. 4.

FIG. 5 is a diagram illustrating the internal configuration of the filter unit 103 illustrated in FIG. 4. The filter unit 103 illustrated in FIG. 5 is one example in which a general complex filter is configured as a finite impulse response (FIR) filter.

In FIG. 5, a signal input to the filter unit 103 is denoted by x(n), and a signal output from the filter unit 103 is denoted by y(n). A filter coefficient is denoted by $a_k$ (k=0, 1, ..., N−1). Each of the input signal x(n) and the output signal y(n) is a signal having a complex number, the filter coefficient $a_k$ is also a complex number, and the input signal x(n), the output signal y(n), and the filter coefficient $a_k$ are respectively given by expressions (1) to (3):

$$x(n)=x_r(n)+j \cdot x_i(n) \qquad (1)$$

where $x_r(n)$ represents a real part of x(n), and $x_i(n)$ represents an imaginary part of x(n).

$$y(n)=y_r(n)+j \cdot y_i(n) \qquad (2)$$

where $y_r(n)$ represents a real part of y(n), and $y_i(n)$ represents an imaginary part of y(n).

$$a_k=a_{kr}+ja_{ki}(k=0,1,\ldots N-1) \qquad (3)$$

where $a_{kr}$ represents a real part of $a_k$, and $a_{ki}$ represents an imaginary part of $a_k$.

The filter unit 103 illustrated in FIG. 5 generally includes N−1 delay elements (denoted by D in FIGS. 5) 151-1, 151-2, ..., and 151-(N−1), N multipliers 152-1, 152-2, ..., and 152-N, and an adder 153.

In accordance with a sampling clock of the filter unit 103, the delay element 151-1 delays the input signal x(n) by an amount corresponding to one clock. Similarly, the delay element 151-2 delays an output signal of the delay element 151-1 by an amount corresponding to one clock, and the delay element 151-(N−1) delays an output signal of the delay element 151-(N−2) by an amount corresponding to one clock.

The multipliers 152-1, 152-2, ..., and 152-N multiply the input signal x(n) and the output signals of the corresponding delay elements 151-1, 151-2, ..., and 151-(N−1) by the filter coefficients $a_k$ (k=0, 1, ..., and N−1).

The adder 153 adds the output signals of the multipliers 152-1 to 152-N and outputs the resulting signal as the output signal y(n) of the filter unit 103.

Using $a_k$, the relationship between x(n) and y(n) is given by expression (4):

$$y(n) = \sum_{k=0}^{N-1} a_k \cdot x(n-k) \qquad (4)$$

The filter unit 103 sets an appropriate complex number for the filter coefficient $a_k$ to thereby obtain an asymmetric frequency characteristic.

Figure 6:
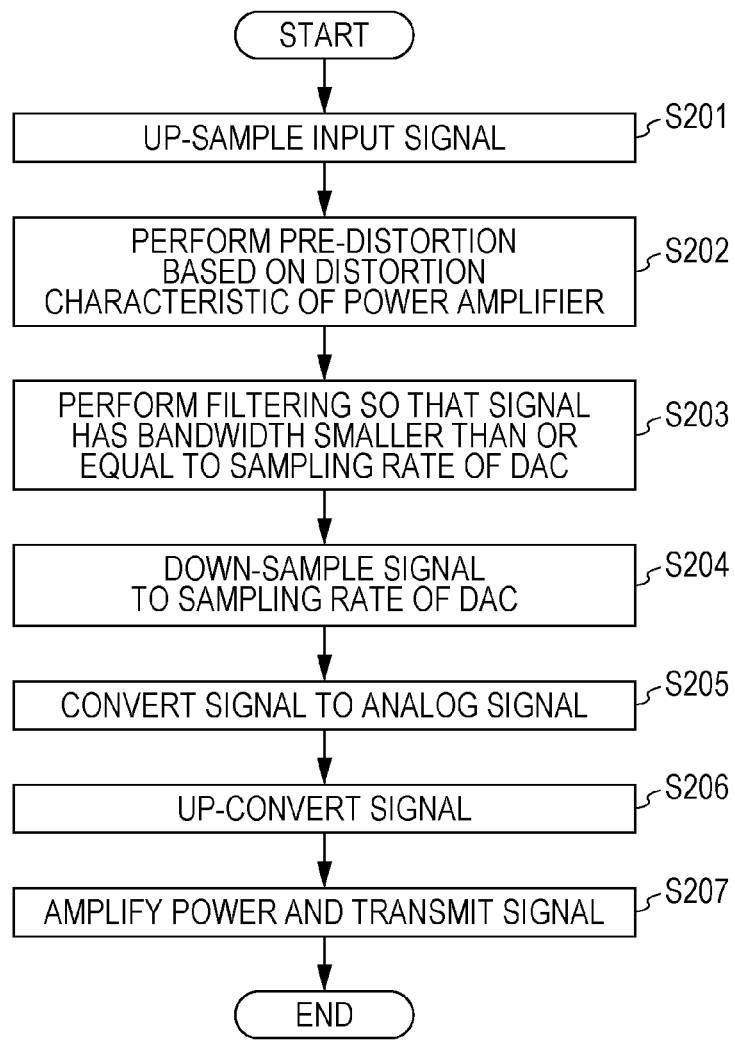
FIG. 6 is a flowchart illustrating an operation procedure of a distortion-compensating power amplifier illustrated in FIG. 4.

Next, the operation of the above-described distortion-compensating power amplifier 100 will be described with reference to FIG. 6. In step S201, the up-sampling unit 101 up-samples an input signal. In step S202, by using a compensation coefficient, the pre-distortion unit 102 gives, to the signal output from the up-sampling unit 101, distortion having an inverse characteristic of a distortion characteristic that is generated in the power amplifier 107.

In step S203, the filter unit 103 band-limits the signal, output from the pre-distortion unit 102, to a bandwidth smaller than or equal to the sampling rate of the DAC 105. In step S204, the down-sampling unit 104 down-samples the signal output from the filter unit 103 so that the sampling rate of the signal is equal to the sampling rate of the DAC 105.

In step S205, the DAC 105 converts the signal, output from the down-sampling unit 104, into an analog signal. In step S206, the frequency converting unit 106 up-converts the signal, output from the DAC 105, from a baseband frequency to a carrier frequency.

In step S207, the power amplifier 107 amplifies the signal output from the frequency converting unit 106 to a predetermined power and transmits the resulting signal via the antenna 108.

Figure 7:
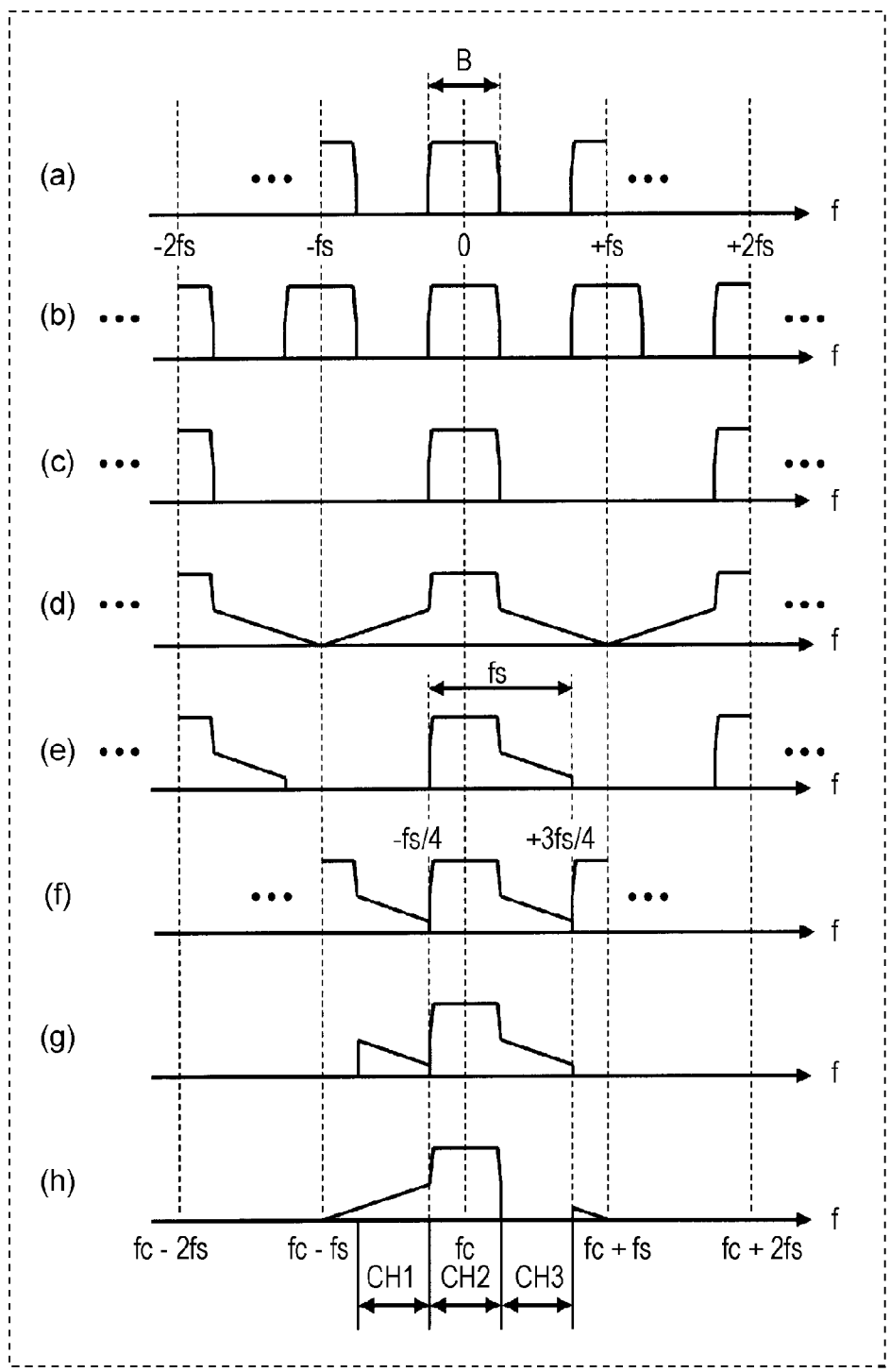
FIG. 7 illustrates signal waveforms in individual blocks in the distortion-compensating power amplifier illustrated in FIG. 4.

Next, the signal waveform in each block in the distortion-compensating power amplifier 100 illustrated in FIG. 4 will be described with reference to FIG. 7. In FIG. 7, the horizontal axis f represents a frequency, and 0 indicates the center frequency of each signal. In FIG. 7, B represents the bandwidth of an input signal, fs represents the sampling rate of the DAC, and fs is equal to 2B. Also, fc represents a carrier frequency, and CH1 to CH3 indicate channels. FIGS. 7(*a*) to 7(*d*) are analogous to FIGS. 3(*a*) to 3(*d*).

FIG. 7(*e*) indicates that an asymmetric frequency characteristic with which the filter unit 103 passes the band of −fs/4 to +3fs/4.

FIG. 7(*f*) indicates that, in the signal output from the down-sampling unit 104, the same signal is repeated for each sampling rate fs of the DAC.

FIG. 7(*g*) indicates that, of the signal output from the DAC 105, components outside the range of −3fs/4 to +3fs/4 are suppressed by a filter (not illustrated) at a stage subsequent to the DAC 105.

FIG. 7(*h*) indicates that, of the signal output from the power amplifier 107, nonlinear distortion that occurs in the power amplifier 107 is canceled in the range of +fs/4 to +3fs/4, that is, in the entire band of CH3.

Although the effect of the distortion compensation is small in CH1, the effect of the distortion compensation is sufficiently obtained in CH3. That is, it is possible to reduce interference with CH3.

Figure 8:
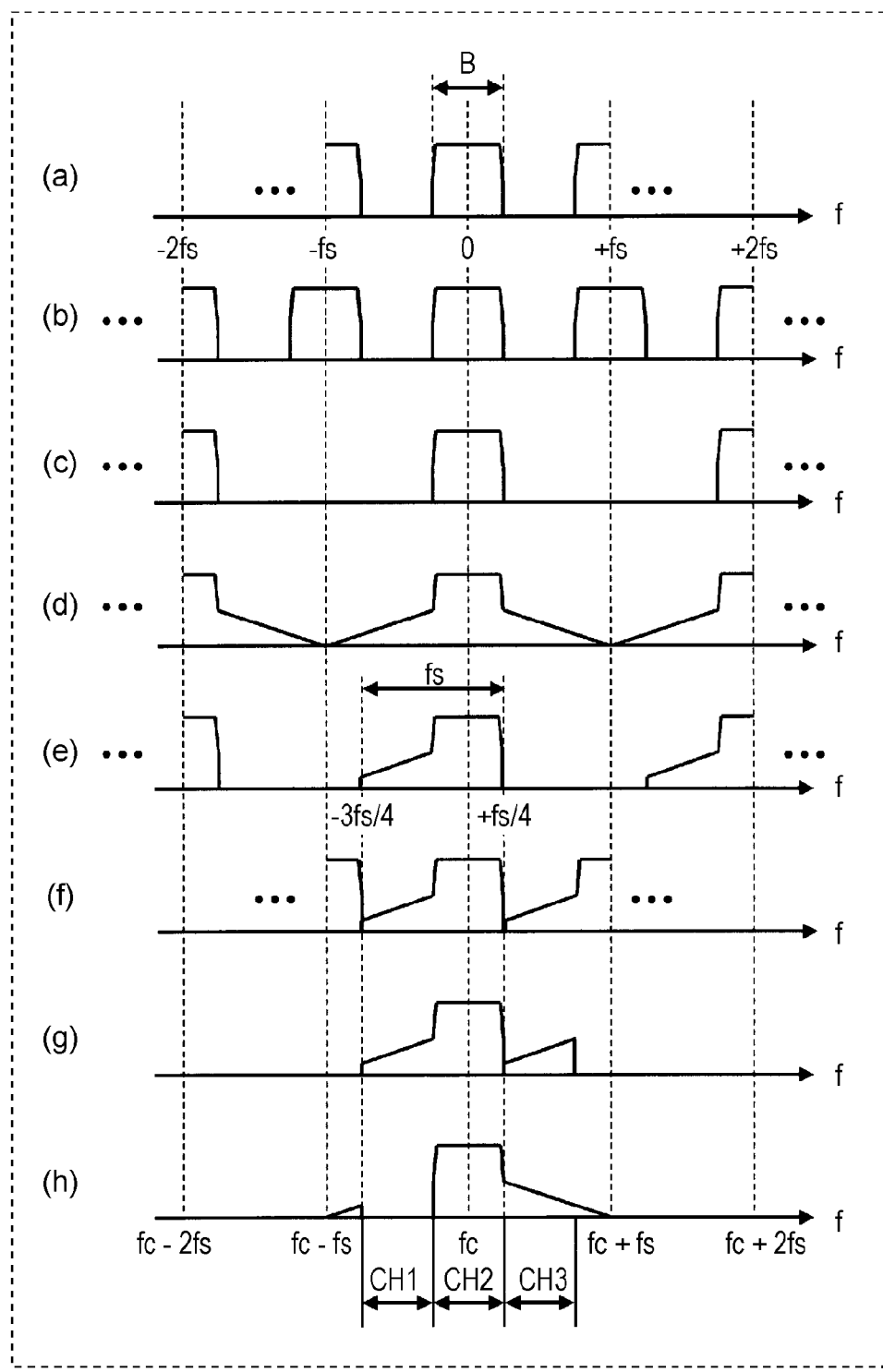
FIG. 8 illustrates other signal waveforms in the individual blocks in the distortion-compensating power amplifier in FIG. 4.

Although, in FIG. 7(*e*), the filter unit 103 has a frequency characteristic of passing the band of −fs/4 to +3fs/4, the filter unit 103 may have a frequency characteristic of passing the band of −3fs/4 to +fs/4 (see FIG. 8(*e*)). The filter unit 103 may switch the passband by switching the filter coefficient of the filter unit 103 to a complex number having a complex conjugate, and the switching can be realized by inverting a polarity (plus/minus) of the imaginary part. In FIGS. 8(*f*) to 8(*h*), it is possible to perform the distortion compensation on a frequency band lower than the center frequency, and it is possible to reduce interference with CH1. FIGS. 8(*a*) to 8(*d*) are analogous to FIGS. 7(*a*) to 7(*d*).

According to the first embodiment, the filter unit in which a complex number is set for the filter coefficient allows the passband to be shifted to one of a high frequency band or a low frequency band relative to the center band of an input signal, and even when the sampling rate of the DAC is not sufficiently high, nonlinear distortion that is generated in the power amplifier is canceled, thus making it possible to reduce interference with communication in an adjacent channel.

Second Embodiment

Figure 9:
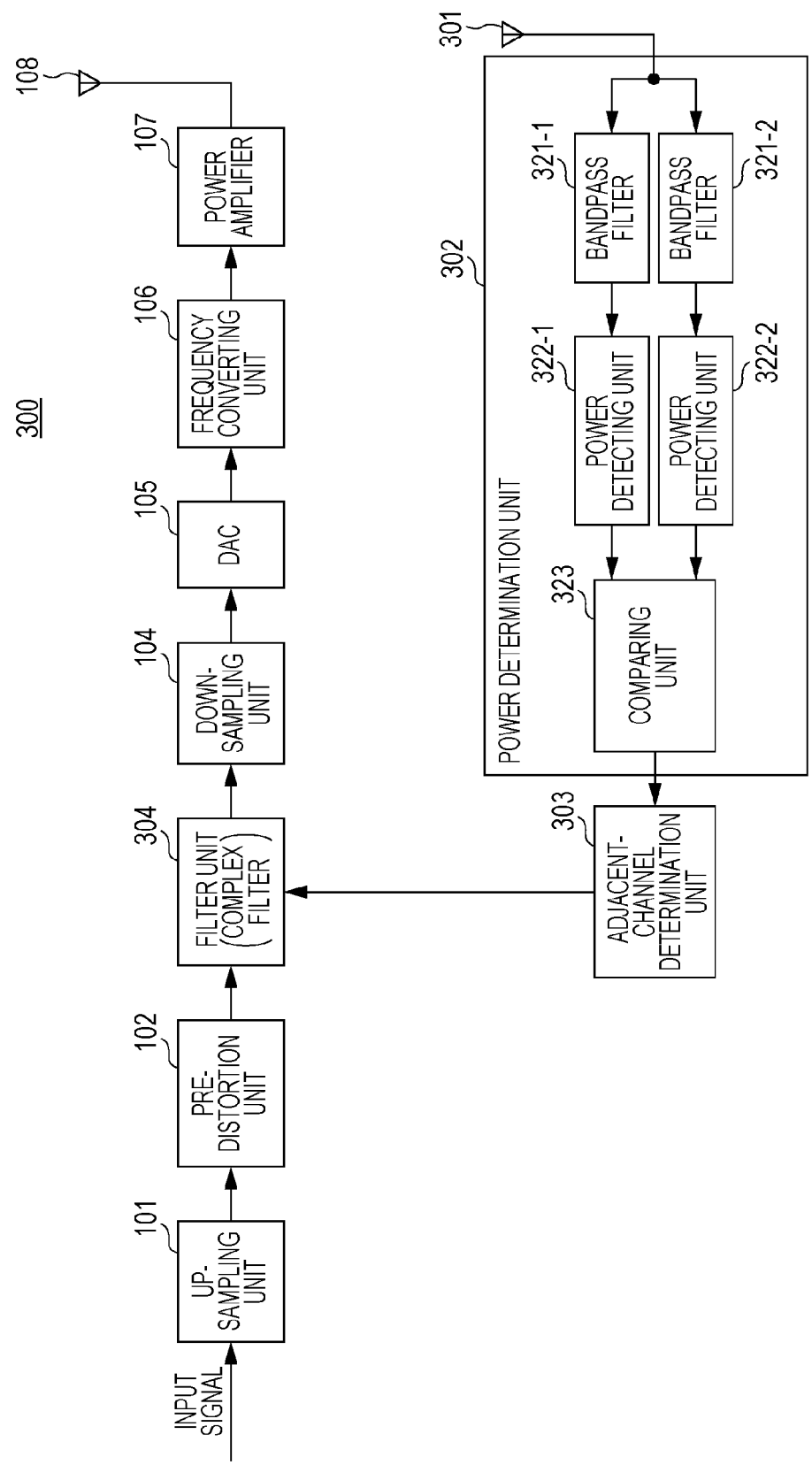
FIG. 9 illustrates the configuration of a distortion-compensating power amplifier according to a second embodiment.

FIG. 9 is a block diagram illustrating the configuration of a distortion-compensating power amplifier 300 according to a second embodiment of the present disclosure. FIG. 9 differs from FIG. 4 in that an antenna 301, a power determination unit 302, and an adjacent-channel determination unit 303 are further added and the filter unit 103 is changed to a filter unit 304.

The power determination unit 302 includes bandpass filters 321-1 and 321-2, power detecting units 322-1 and 322-2, and a comparing unit 323 and determines whether or not reception power of each band of a received signal is larger or smaller.

The bandpass filters 321-1 and 321-2 are filters for passing specific bands of signals received by the antenna 301. For example, when a communication apparatus having the distortion-compensating power amplifier 300 performs transmission using CH2, one bandpass filter 321-1 passes the band of CH1 (i.e., the channel adjacent to a frequency lower than CH2). The other bandpass filter 321-2 passes the band of CH3 (i.e., the channel adjacent to a frequency higher than CH2).

The power detecting units 322-1 and 322-2 detect the powers of signals output from the bandpass filters 321-1 and 321-2, respectively, and output detection results to the comparing unit 323. For example, through combination of a detector and a low-pass filter (LPF), each of the power detecting units 322-1 and 322-2 may convert the power value into an analog voltage value. Through use of an analog-to-digital converter (ADC), each of the power detecting units 322-1 and 322-2 may convert a voltage value corresponding to the power value into a digital value.

The comparing unit 323 determines which channel has a larger power, based on the power detection results output from the two power detecting units 322-1 and 322-2, and outputs the determination result to the adjacent-channel determination unit 303.

The adjacent-channel determination unit 303 determines that the channel having the larger power is to be subjected to the distortion compensation, based on the determination result output from the comparing unit 323, and outputs a determination result to the filter unit 304.

Based on the determination result output from the adjacent-channel determination unit 303, the filter unit 304 switches the filter coefficient to pass, of the signal output from the pre-distortion unit 102, a frequency band on which the distortion compensation is to be performed.

Figure 10:
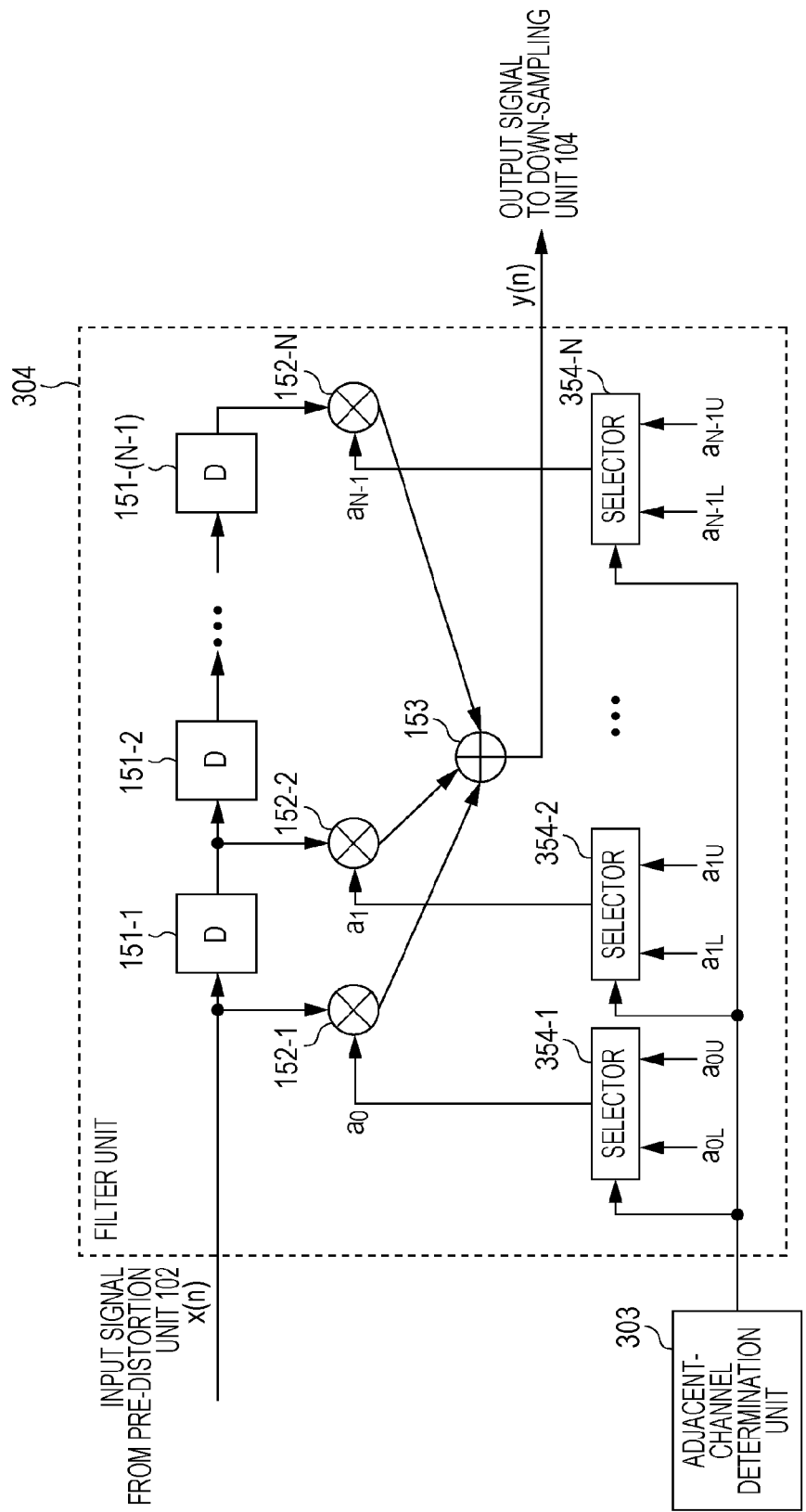
FIG. 10 illustrates the internal configuration of a filter unit illustrated in FIG. 9.

FIG. 10 is a block diagram illustrating the internal configuration of the filter unit 304 illustrated in FIG. 9. FIG. 10 differs from FIG. 5 in that a plurality of selectors 354-1, 354-2, . . . , and 354-N are added.

Each of the selectors 354-1, 354-2, . . . , and 354-N has two filter coefficients $a_{kL}$ and $a_{kU}$ (k=0, 1, . . . , and N−1). The filter coefficient $a_{kL}$ is a filter coefficient for performing the distortion compensation on a lower-frequency side (CH1 side). The filter coefficient $a_{kU}$ is a filter coefficient for performing compensation distortion on a higher frequency side (CH3 side). The filter coefficients $a_{kL}$ and $a_{kU}$ are also complex numbers and have a complex conjugate relationship. In accordance with an instruction from the adjacent-channel determination unit 303, the selectors 354-1, 354-2, . . . , and 354-N each select either the filter coefficient $a_{kL}$ or the filter coefficient $a_{kU}$ and outputs the selected coefficients to the corresponding multipliers 152-1, 152-2, . . . , and 152-N.

That is, the distortion-compensating power amplifier 300 can switch between the distortion compensation for a low frequency band and the distortion compensation for a high frequency band in accordance with the instruction from the adjacent-channel determination unit 303.

According to the second embodiment, it is possible to reduce interference with a channel used by a terminal, by performing the distortion compensation on an adjacent channel having large power.

Third Embodiment

Figure 11:
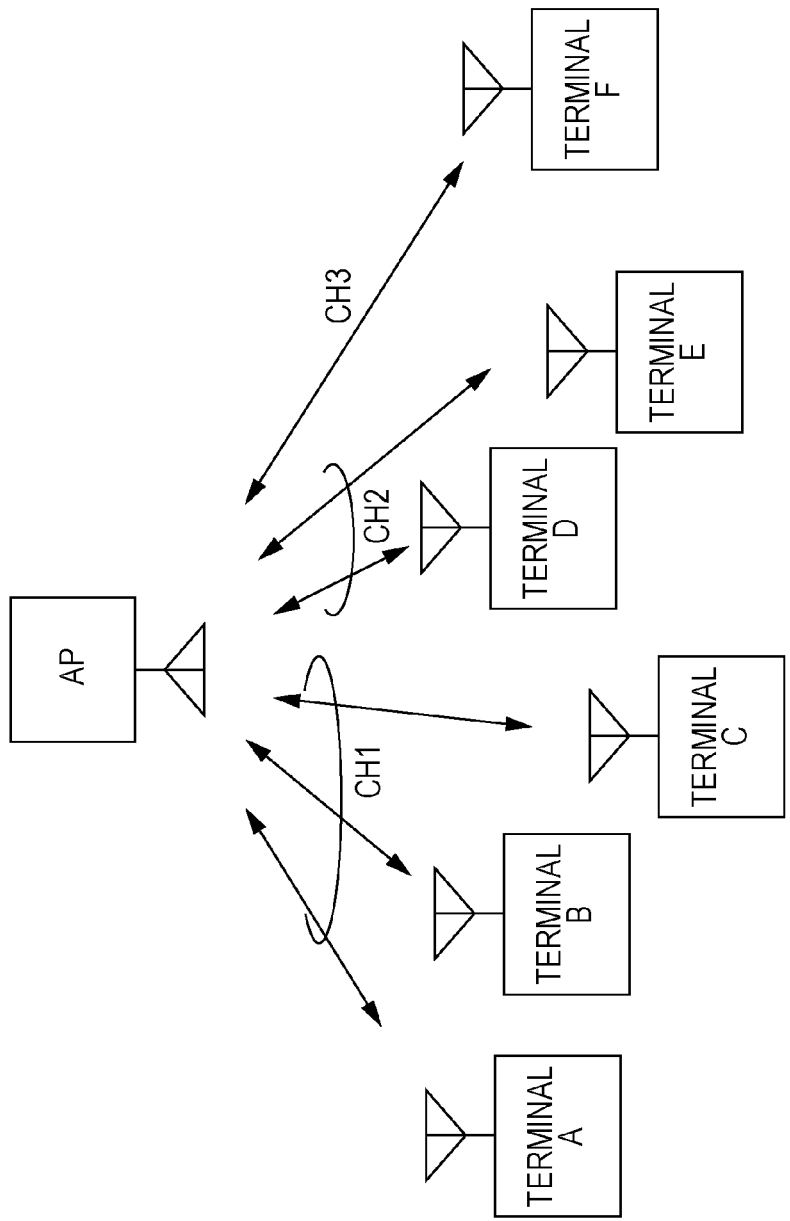
FIG. 11 illustrates a state in which an AP communicates with a plurality of terminals.

Communication between an access point (AP) and a plurality of terminals will be described in a third embodiment of the present disclosure. In FIG. 11, the AP can perform communication in parallel by using a plurality of channels CH1 to CH3. The AP recognizes that the through which channel each terminal performs communication, and the AP has, for example, a table illustrated in FIG. 12A or 12B. In the example illustrated in FIG. 11 and FIG. 12A or 12B, terminals A, B, and C perform communication through CH1, terminals D and E perform communication through CH2, and terminal F performs communication through CH3.

Figure 13:
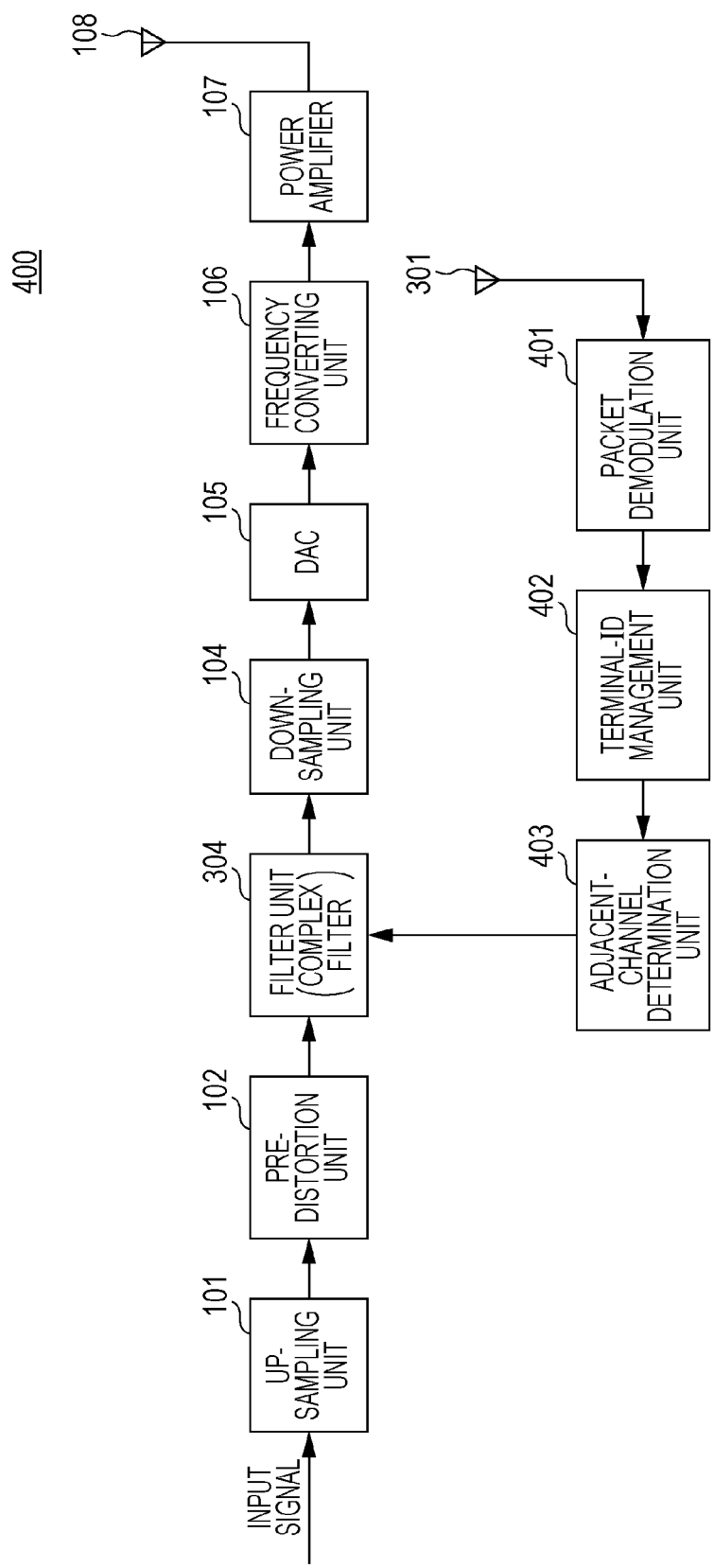
FIG. 13 illustrates the configuration of a distortion-compensating power amplifier according to a third embodiment.

FIG. 13 is a block diagram illustrating the configuration of a distortion-compensating power amplifier 400 according to the third embodiment of the present disclosure. FIG. 13 differs from FIG. 9 in that a packet demodulation unit 401 and a terminal-ID management unit 402 are added, the power determination unit 302 is eliminated, and the adjacent-channel determination unit 303 is changed to an adjacent-channel determination unit 403.

The packet demodulation unit 401 demodulates a packet signal received by the antenna 301, extracts information including at least one of, for example, a terminal ID, a communication channel in use, and another end of the communication, the information being included in the packet signal, and outputs the extracted information to the terminal-ID management unit 402.

The terminal-ID management unit 402 accumulates at least one of the terminal ID, the communication channel in use, and the other end of the communication, the information being output from the packet demodulation unit 401, and creates and holds, for example, a table illustrated in FIG. 12A or 12B. The terminal-ID management unit 402 outputs, to the adjacent-channel determination unit 403, number-of-terminals information indicating the number of terminals that perform communication through each channel.

The adjacent-channel determination unit 403 determines that an adjacent channel through which the number of terminals that perform communication is large is to be subjected to the distortion compensation, based on the number-of-terminals information output from the terminal-ID management unit 402, and outputs the determination result to the filter unit 304. For example, when the AP communicates with terminal D through CH2, the adjacent-channel determination unit 403 determines the band of the CH1 side is to be subjected to the distortion compensation, since the number of terminals that perform communication through CH1 is larger between the adjacent channels CH1 and CH3. Since this makes it possible to reduce interference with CH1, it is possible to suppress a reduction in the throughput of the entire system.

According to the third embodiment, since the distortion compensation is performed on an adjacent channel through which the number of terminals that perform communication is large, it is possible to reduce interference with a channel used by a large number of terminal, and it is possible to suppress a reduction in the throughput of the system.

The table illustrated in FIG. 12A or 12B may be transmitted from the AP to the terminals, which allows each terminal, other than the AP, to compensate for distortion in an adjacent channel through which the number of terminals that perform communication is large. For example, when the table is transmitted from the AP to terminal D, terminal D performs the distortion compensation on the adjacent channel through which the number of terminals that perform communication is large, that is, on the band of the CH1 side, based on the table transmitted from the AP. Each time the table is updated, the AP may transmit the table to each terminal. In such a case, even when the number of terminals that are performing communication with the AP increases or decreases, the terminal can appropriately select a band on which the distortion compensation is to be performed.

Fourth Embodiment

Figure 14:
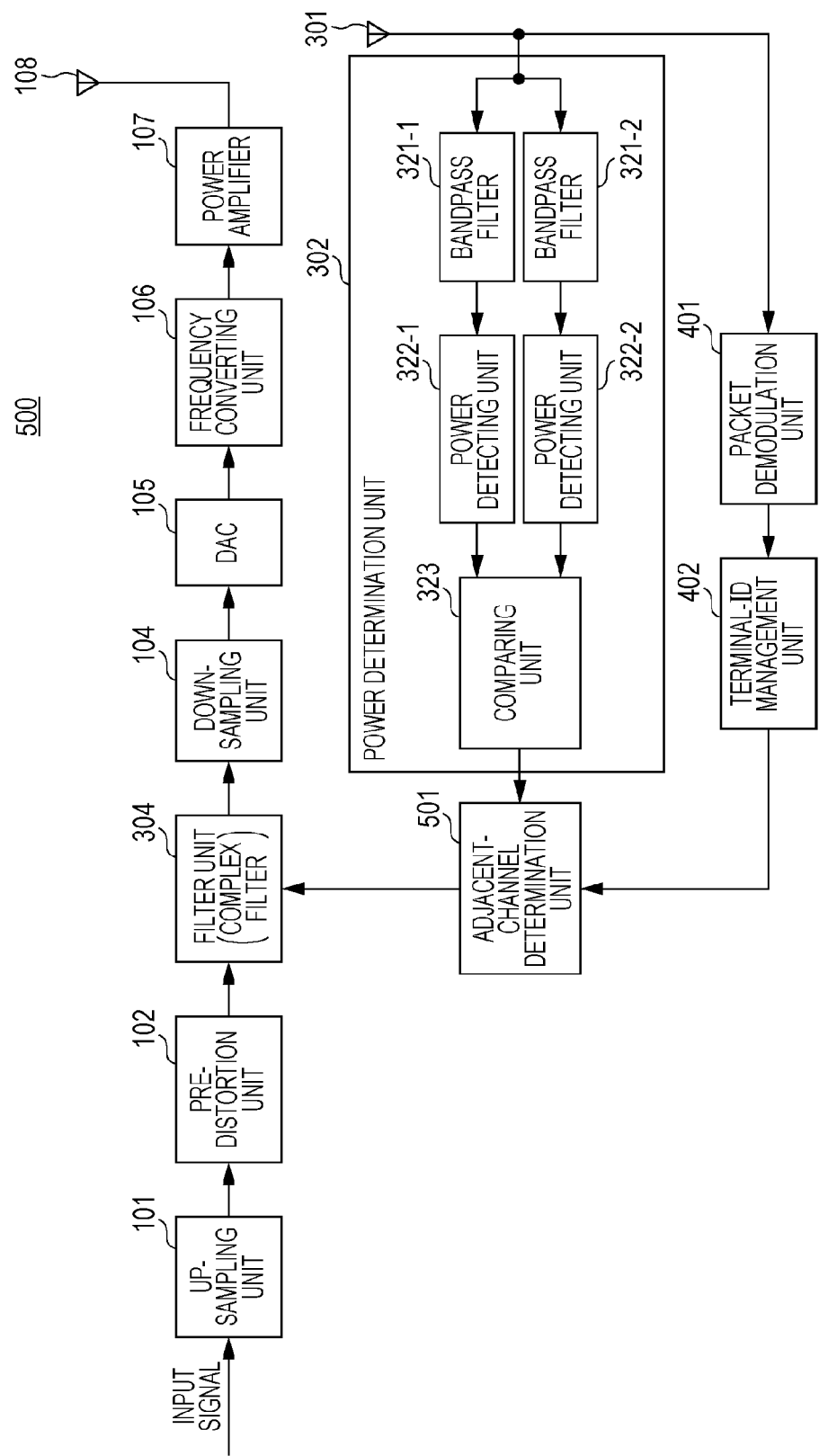
FIG. 14 illustrates the configuration of a distortion-compensating power amplifier according to a fourth embodiment.

FIG. 14 is a block diagram illustrating the configuration of a distortion-compensating power amplifier 500 according to a fourth embodiment of the present disclosure. FIG. 14 differs from FIG. 4 in that an adjacent-channel determination unit 501, the antenna 301 and the power determination unit 302 in FIG. 9, and the packet demodulation unit 401 and the terminal-ID management unit 402 in FIG. 13 are added, and the filter unit is changed to the filter unit 304 in FIG. 9 or 13.

Based on the determination result output from the comparing unit 323 and the number-of-terminals information output from the terminal-ID management unit 402, the adjacent-channel determination unit 501 determines that the distortion compensation is to be performed on the adjacent channel in which power is larger or on the adjacent channel through which the number of terminals that are performing communication is larger. The adjacent-channel determination unit 501 then outputs the determination result to the filter unit 304.

Figure 15:
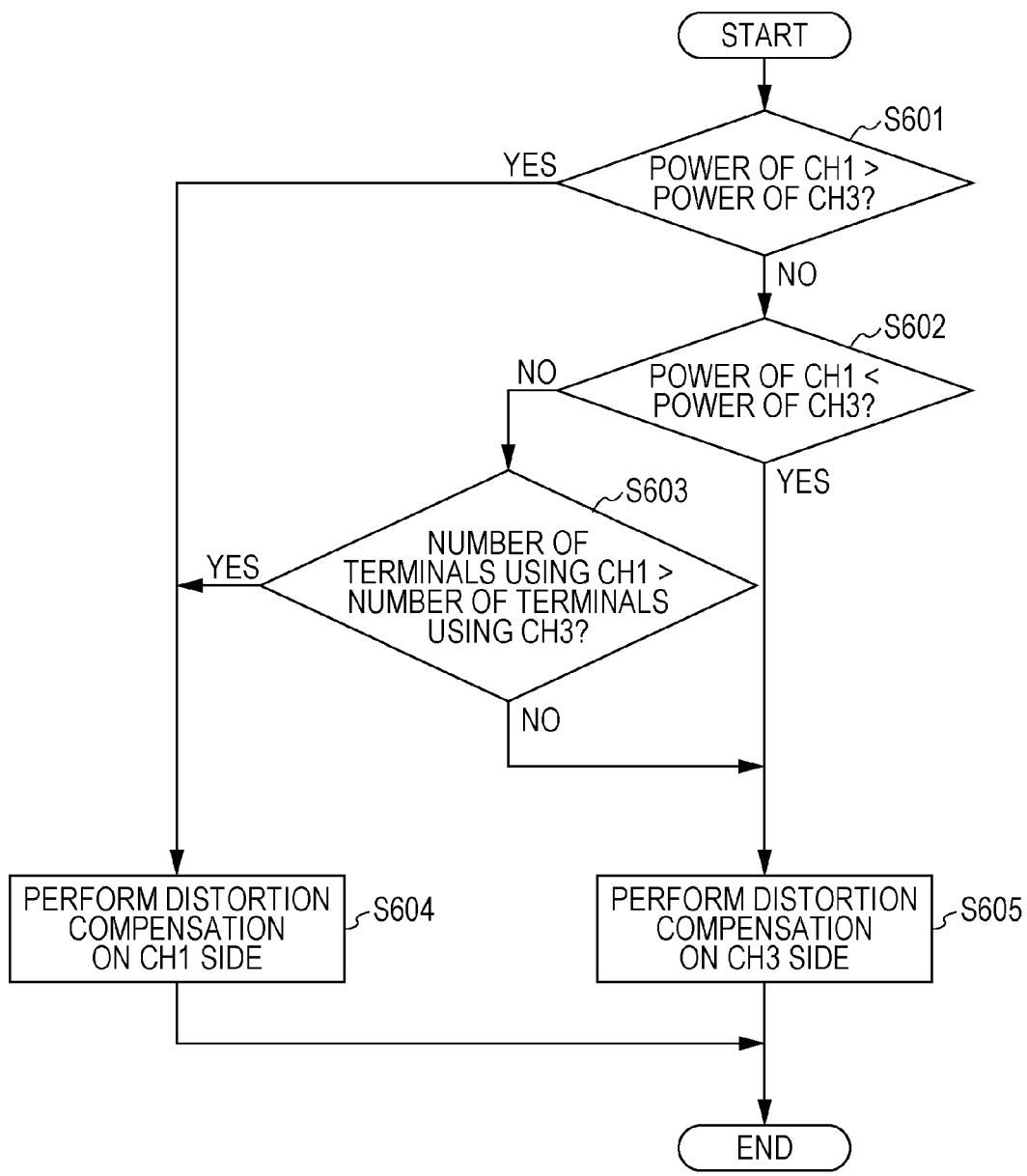
FIG. 15 is a flowchart illustrating an operation procedure of an adjacent-channel determination unit illustrated in FIG. 14.

FIG. 15 is a flowchart illustrating an operation procedure of the adjacent-channel determination unit 501 illustrated in FIG. 14. A description will be given of a case in which a communication apparatus having the distortion-compensating power amplifier 500 illustrated in FIG. 14 performs communication using CH2 and performs the distortion compensation on one of CH1 and CH3 that are adjacent channels.

In step S601, a determination is made as to whether or not the power of CH1 is larger than the power of CH3. If the power of CH1 is larger (YES), the process proceeds to step S604, and if the power of CH1 is smaller (NO), the process proceeds to step S602.

In step S602, a determination is made as to whether or not the power of CH1 is smaller than the power of CH3. If the power of CH1 is smaller (YES), the process proceeds to step S605, and if the power of CH1 is larger (NO), the process proceeds to step S603.

In step S603, a determination is made as to whether or not the number of terminals using CH1 is larger than the number of terminals using CH3. If the number of terminals using CH1 is larger than the number of terminals using CH3 (YES), the process proceeds to step S604, and if the number of terminals using CH1 is smaller than or equal to the number of terminals using CH3 (NO), the process proceeds to step S605.

In step S604, it is determined that the distortion compensation is performed on the CH1 side, and in step S605, it is determined that the distortion compensation is performed on the CH3 side.

If the power of CH1 and the power of CH3 are the same, a channel suitable for the distortion compensation is selected through the determination based on whether the number of terminals is larger or smaller, thus making it possible to effectively reduce interference with communication in the adjacent channel. The case in which the power of CH1 and the power of CH3 are the same does not necessarily have to be a case in which they are exactly the same and may also be a case in which the power difference therebetween is within a certain range.

According to the fourth embodiment, since an adjacent channel on which the distortion compensation is to be performed is determined based on the powers of adjacent channels and the number of terminals, it is possible to effectively reduce interference with the adjacent channel.

Although a case in which a channel on which the distortion compensation is to be performed is determined using the power values and the number of terminals has been described in the second to fourth embodiments, the present disclosure is not limited thereto, and a parameter other than the power values and the number of terminals may also be used.

For example, a communication quality required for data that is communicated may also be used. When a terminal that is communicating data, such as streaming data, that does not permit delay and transmission error exists, a channel through which the terminal is communicating may be subjected to the distortion compensation with higher priority.

Also, when a terminal is communicating a large amount of data exists, the terminal uses an channel for a long period of time, and thus a channel through which the terminal is communicating may be subjected to the distortion compensation with higher priority. These parameters may also be combined with the power values and the number of terminals. Making a determination by combining a plurality of parameters makes it possible to perform distortion compensation with which a reduction in the throughput of the entire system is suppressed.

Although a case in which an FIR filter is used for the filter unit has been described above in each embodiment, the present disclosure is not limited thereto, and an infinite impulse response (IIR) filter may also be used for the filter unit.

Although an example of a case in which the sampling rate of an input signal is equal to the sampling rate of the DAC has been described above in each embodiment, the present disclosure is not limited thereto, and the sampling rate of an input signal may be different from the sampling rate of the DAC. For example, when the sampling rate of an input signal is higher than the sampling rate of the DAC, and an influence of aliasing can be suppressed after the pre-distortion unit gives distortion having the inverse characteristic of the distortion characteristic generated in the power amplifier, the up-sampling unit may be omitted. For example, when the sampling rates of an input signal, the pre-distortion unit, and the filter unit are represented by fs=4B, and the sampling rates of the down-sampling unit and the DAC are represented by fs=2B, the up-sampling unit may be omitted.

Although, in each embodiment described above, the filter unit performs the band limitation so that the bandwidth after the band limitation is fs, the filter unit may also perform band limitation by which the bandwidth after the band limitation is smaller than fs. When the bandwidth after the band limitation is reduced, the effect of canceling the nonlinear distortion is reduced, but conditions for designing the filter unit or the filter subsequent to the DAC can be relaxed.

Although the sampling rate in the up-sampling unit has been described above in each embodiment as being twice the sampling rate of the DAC, the present disclosure is not limited thereto, and the sampling rate in the pre-distortion unit may be higher than twice the sampling rate of the DAC.

The sampling rate in the up-sampling unit may be determined according to the broadening of the frequency of a signal obtained after distortion having the inverse characteristic of the distortion characteristic generated in the power amplifier is applied, that is, according to the nonlinear distortion characteristic of the power amplifier. When the nonlinear distortion in the power amplifier affects broader frequencies, up-sampling may be performed using a sampling rate that is higher than twice the sampling rate of the DAC.

Although an example in which adjacent channels exist at both a lower frequency side and a higher frequency side has been described above in each embodiment, the present disclosure is not limited thereto, and an endmost channel among available channels may also be used. For example, when four channels CH1, CH2, CH3, and CH4 that exist in this order from a lower frequency side are available, and one terminal uses CH1, the distortion compensation for the low-frequency band may be omitted, since a terminal that causes interference does not exist at frequencies lower than CH1.

Although various embodiments have been described above with reference to the drawings, it goes without saying that the present disclosure is not limited to such examples. It is apparent to those skilled in the art that various variations and modifications can be conceived within the scope recited in the claims, and it is to be understood that such variations and modifications also naturally belong to the technical scope of the present disclosure.

Although the present disclosure has been described above in each embodiment in conjunction with an example of a configuration using hardware, the present disclosure can also be realized by software in cooperation with hardware.

The functional blocks used in the above description in each embodiment can typically be realized as a large-scale integration (LSI) circuit. The functional blocks may be individually integrated into single chips or at least one or all of the functional blocks may be integrated into a single chip. Although the functional blocks are implemented in the form of an LSI in this case, they may also be called an integrated circuit (IC), a system LSI, a super LSI, or an ultra LSI depending on a difference in the degree of integration.

The scheme for integrating the functional blocks into an integrated circuit is not limited to a scheme for LSI and may be realized with a dedicated circuit or a general-purpose processor. The functional blocks can also be implemented using a field programmable gate array (FPGA) that can be programmed after manufacture of an LSI or a reconfigurable processor that allows reconfiguration of connections or settings of circuit cells in an LSI.

In addition, when a technology for circuit integration that replaces LSI becomes available with the advancement of semiconductor technology or another derivative technology, such a technology may also naturally be used to integrate the functional blocks. For example, biotechnology is applicable to the integration.

The present disclosure also include the following various aspects of embodiments of the present disclosure.

A distortion-compensating power amplifier according to a first aspect of the present disclosure compensates for nonlinear distortion in a power amplifier and amplifies power. The distortion-compensating power amplifier includes: a power amplifier, a predistorter that performs pre-distortion processing, the pre-distortion processing applying an inverse characteristic of a distortion characteristic that is generated in the power amplifier to an input signal; a filter that performs band limitation on the pre-distorted input signal by using a frequency characteristic that is asymmetric with respect to a center frequency of the input signal, the filter having a filter coefficient that is a complex number; a down-sampler that down-samples the band-limited input signal; and a digital-to-analog converter that converts the down-sampled input signal from a digital signal to an analog signal.

In the distortion-compensating power amplifier according to the first aspect, a distortion-compensating power amplifier according to a second aspect of the present disclosure may further include: an up-sampler that up-samples the input signal that is input thereto. The predistorter may perform the pre-distortion processing on the up-sampled input signal, and the digital-to-analog converter may have a sampling rate that is lower than or equal to predetermined times of a bandwidth of the input signal that is input to the up-sampler.

In the distortion-compensating power amplifier according to the first aspect, the filter may vary the filter coefficient to perform the band limitation.

In the distortion-compensating power amplifier according to the second aspect, the filter may vary the filter coefficient by inverting a polarity of an imaginary part of the filter coefficient.

In the distortion-compensating power amplifier according to the second aspect, the filter may vary the filter coefficient, based on reception power of a signal in a channel adjacent to a channel used for communication of the input signal.

In the distortion-compensating power amplifier according to the second aspect, the filter may vary the filter coefficient, based on the number of terminals that perform communication by using a channel adjacent to a channel used for communication of the input signal.

The distortion-compensating power amplifier according to the present disclosure can be applied to, for example, wireless communication devices.

What is claimed is:

1. A distortion-compensating power amplifier comprising:
   a power amplifier;
   a predistorter that performs pre-distortion processing, the pre-distortion processing applying an inverse characteristic of a distortion characteristic that is generated in the power amplifier to an input signal in a first channel;
   a filter that performs band limitation on the pre-distorted input signal by using a frequency characteristic that is shifted to one of a second channel which is a lower frequency band adjacent to the first channel and a third channel which is a higher frequency band adjacent to the first channel with respect to a center frequency of the first channel, the filter having a filter coefficient that is a complex number;
   a down-sampler that down-samples the band-limited input signal; and
   a digital-to-analog converter that converts the down-sampled input signal from a digital signal to an analog signal.

2. The distortion-compensating power amplifier according to claim 1, comprising:
   an up-sampler that up-samples the input signal that is input thereto,
   wherein the predistorter performs the pre-distortion processing on the up-sampled input signal, and
   the digital-to-analog converter has a sampling rate that is lower than or equal to determined times of a bandwidth of the input signal that is input to the up-sampler.

3. The distortion-compensating power amplifier according to claim 1,
   wherein the filter varies the filter coefficient to perform the band limitation.

4. The distortion-compensating power amplifier according to claim 2,
   wherein the filter varies the filter coefficient by inverting a polarity of an imaginary part of the filter coefficient.

5. The distortion-compensating power amplifier according to claim 2,
   wherein the filter varies the filter coefficient, based on reception power of a signal in one of the second channel and the third channel.

6. The distortion-compensating power amplifier according to claim 2,
   wherein the filter varies the filter coefficient, based on a number of terminals that perform communication by using one of the second channel and the third channel.

7. A method for compensating for nonlinear distortion, the method comprising:
   performing pre-distortion processing, the pre-distortion processing applying an inverse characteristic of a distortion characteristic that is generated in a power amplifier to an input signal in a first channel;
   performing filter processing for performing band limitation on the pre-distorted input signal by using a frequency characteristic that is shifted to one of a second channel which is a lower frequency band adjacent to the first channel and a third channel which is a higher frequency band adjacent to the first channel with respect to a center frequency of the first channel, the filter processing using a filter coefficient that is a complex number;
   performing down-sampling on the band-limited input signal; and
   converting the down-sampled input signal from a digital signal to an analog signal.

8. The distortion-compensating power amplifier according to claim 1, comprising a frequency converter that up converts the converted analog signal output from the digital-to-analog converter from a baseband to a carrier frequency.

9. The method for compensating for nonlinear distortion according to claim 7, comprising up converting the converted analog signal from a baseband to a carrier frequency.

10. The method for compensating for nonlinear distortion according to claim 7, comprising up sampling the input signal, the pre-distortion processing being performed on the up sampled signal and the converting utilizes a sampling rate that is lower than or equal to the term and times of a bandwidth of the input signal that is up sampled.

11. The method for compensating for nonlinear distortion according to claim 7, wherein the filter processing varies the filter coefficient to perform the band limitation.

12. The method for compensating for nonlinear distortion according to claim 11, wherein the filter processing varies the filter coefficient by inverting a polarity of an imaginary part of the filter coefficient.

13. The method for compensating for nonlinear distortion according to claim 11, wherein the filter processing varies the filter coefficient, based on reception power of a signal in one of the second channel and the third channel.

14. The method for compensating for nonlinear distortion according to claim 11, wherein the filter processing varies the filter coefficient, based on a number of terminals that perform communication by using one of the second channel and the third channel.

* * * * *